US012293445B2

(12) United States Patent
Hopkins et al.

(10) Patent No.: US 12,293,445 B2
(45) Date of Patent: May 6, 2025

(54) PROCEDURAL ANIMATION ENGINE AND EDITOR FOR SAMPLE-BASED DESIGN OF STYLIZED WALKING GAITS FOR BIPEDAL ROBOTS

(71) Applicant: DISNEY ENTERPRISES, INC., Burbank, CA (US)

(72) Inventors: Michael Anthony Hopkins, Richmond, VA (US); Kyle Michael Cesare, Boulder, CO (US); Georg Wiedebach, Glendale, CA (US); Jared Edward Bishop, Ventura, CA (US)

(73) Assignee: DISNEY ENTERPRISES, INC., Burbank, CA (US)

( * ) Notice: Subject to any disclaimer, the term of this patent is extended or adjusted under 35 U.S.C. 154(b) by 453 days.

(21) Appl. No.: 17/700,658

(22) Filed: Mar. 22, 2022

(65) Prior Publication Data

US 2023/0306667 A1    Sep. 28, 2023

(51) Int. Cl.
*B25J 5/00* (2006.01)
*G06F 3/04815* (2022.01)
*G06F 3/04847* (2022.01)
*G06F 30/20* (2020.01)
*G06T 13/40* (2011.01)

(52) U.S. Cl.
CPC .............. *G06T 13/40* (2013.01); *B25J 5/00* (2013.01); *G06F 3/04815* (2013.01); *G06F 3/04847* (2013.01); *G06F 30/20* (2020.01); *G06T 2200/24* (2013.01)

(58) Field of Classification Search
CPC ........ G06T 13/40; G06T 2200/24; B25J 5/00; B25J 13/06; G06F 3/04815; G06F 3/04847; G06F 30/20; B62D 57/032
See application file for complete search history.

(56) References Cited

U.S. PATENT DOCUMENTS

| 2005/0075755 | A1* | 4/2005 | Takenaka | B62D 57/032 |
| | | | | 700/245 |
| 2006/0108958 | A1* | 5/2006 | Brenner | H02P 23/04 |
| | | | | 318/432 |
| 2011/0301756 | A1* | 12/2011 | Yoshiike | B62D 57/032 |
| | | | | 901/1 |
| 2016/0243699 | A1* | 8/2016 | Kim | B25J 9/1605 |

(Continued)

*Primary Examiner* — Kira Nguyen
(74) *Attorney, Agent, or Firm* — Dorsey & Whitney LLP

(57) ABSTRACT

A robot design and control system including a procedural animation engine and a graphical animation editor that enable animators to author stylized walking gaits achievable by physical robotic characters, including bipedal robots of varying design. The animation engine generates dynamically feasible reference trajectories for omnidirectional walking given a desired walking velocity that may be input from a joystick or an artificial intelligence (AI) planner. This allows a legged robot to walk along an arbitrary path while expressing a custom animation "style," e.g., a happy walk, a sneaky walk, or other manner of walking. The stylized walking motion or gait is generalized by the animation engine from a small number of animation samples that are defined at key walking velocities and tracked using a whole-body controller. The set of samples that are used as input to define a walking style is authored by an animator using the animation editor.

22 Claims, 13 Drawing Sheets

(56) References Cited

U.S. PATENT DOCUMENTS

2019/0204848 A1* 7/2019 Xiong .................. G05D 1/0268
2020/0369333 A1* 11/2020 Lavalley .............. B25J 11/0035
2023/0334744 A1* 10/2023 Liu ......................... A63F 13/65

* cited by examiner

PROCEDURAL ANIMATION ENGINE AND EDITOR FOR SAMPLE-BASED DESIGN OF STYLIZED WALKING GAITS FOR BIPEDAL ROBOTS

BACKGROUND

1. Field of the Description

The present description relates, in general, to robots (or "robotic systems" or "robotic characters") and control systems and methods for such robots. More particularly, the description relates to methods and systems of generating control signals for a legged robotic system such as a bipedal robot (and to controllers implementing such a method and robotic systems or robots with such controllers) that facilitates procedural animation and sample-based design of stylized walking gaits with physical constraints.

2. Relevant Background

The control of humanoid or bipedal robots to provide stylized walking remains a challenging problem. Ideally, it is desirable to design creative authoring tools and control software that enable robotic characters that walk with the same fluidness and expressivity as their computer animated or human counterparts. The walking control problem is complicated by two main challenges.

First, walking gaits must satisfy the kinematic and dynamic constraints inherent to whole-body locomotion. For example, the rate of change of the character's momentum must be consistent with the forces imparted on each foot when in contact with the ground. Those forces must also satisfy certain friction constraints to prevent the foot from slipping during the support phase. While a walking animation for a virtual character can violate these constraints and still appear physically plausible to viewers, animation content that is authored for a robot must be governed by the laws of physics to be realized on hardware to achieve a useful walking gait for a particular legged robot.

Second, walking gaits vary as a function of the character's velocity. As an example, when a character accelerates, the stride length or the step frequency may increase. How the gait evolves often depends on the desired style. As a result, it is generally not possible to define a complete walking style from a single keyframed animation. The style must generalize to a continuous range of velocities for forward and reverse walking, turning, strafing, and so on.

Existing techniques for generating control signals for walking bipedal robots have not been entirely successful, which results in an ongoing demand for new processes for designing stylized walking gaits. Character animation represents one prior approach to generating walking gaits for robots. Using traditional animation tools, a character animator is free to design arbitrary motions limited only by the constraints imposed on the animation rig. To create realistic motions, the animator must take care that the character does not move in a manner that violates the laws of physics, e.g., fails faster than gravity or exhibits an impossible center of mass trajectory. Tools, such as center of mass inverse kinematics (IK) or foot locking solvers, exist that can simplify the animation process by imposing some physical constraints on the authored animations. However, these tools often ignore the full dynamics of the character or rely on unrealistic animation rigs. Walking animations authored in this manner typically require post-processing to be executed on hardware, which may significantly alter the resulting gait, thereby losing the original artistic intent. Animation blending is often used to generate omnidirectional gaits from a set of predefined walking animations. However, popular gait blending methods, e.g., blend trees, animation graphs, and the like, often use relatively simple interpolation methods that do not guarantee satisfaction of kinematic or dynamic constraints. A common artifact of these methods is unrealistic foot slipping. Some methods rely on post-processing to try to correct the blended motion, but these are often not wholly effective. For example, the use of an IK solver may be used to change the ankle joint positions to keep a grounded foot flat during full contact.

A second approach to walking gait design involves use of data-driven methods. A motion capture ("MoCap") rig may be used to gather a substantial amount of stylized walking data directly from a human actor. This performance data can then be used to train a computer program that is capable of generating omnidirectional walking motions that mimic the actor's style of movement including their walking gait. While data-driven methods are highly flexible, they also present a number of disadvantages. Unless motion constraints are encoded into the trained policy or the learning process, data-driven methods may generate physically unrealistic motions, which may require post-processing to correct. In cases where the actor's morphology differs from the animated character, the MoCap data must also be retargeted to account for the kinematic differences. Additionally, these methods typically do not take into account the differing dynamics of the actor and the character, which can drastically affect the timing of feasible motions. MoCap data is also difficult to edit and can require extensive manual post-processing by an artist or animator.

Moreover, it is desirable to provide artists and animation designers with authoring tools that enable the rapid creation of expressive and believable, while being physically-feasible, gaits. It is also preferred that these tools be useful for designing walking gaits for robotic characters having arbitrary or wide ranging physical designs, which may even include fantasy characters.

SUMMARY

With the above and other challenges with walking gait design in mind, a robot control method (and associated robot controllers and robots operating with such methods and controllers) is described herein that provides processes, steps, or algorithms for generating control signals for a legged robotic system such as a bipedal robot (and to controllers implementing such a method and robotic systems or robots with such controllers). In some cases, an animation engine and an editor are used to enable procedural animation for sample-based design of stylized walking gaits with physical constraints.

In brief, an animation or robot control system is described herein that may be considered a two-part system including a procedural animation engine and a graphical animation editor that enable animators to author stylized walking gaits that can be achieved by robotic characters, including bipedal robots with varying configurations. The animation engine (e.g., software or code executed, in the design phase, by a processor of a designer/animator work station/computer system or run or executed on a computer attached to the robot for wireless operation in the deployment phase or the like) generates dynamically feasible reference trajectories for omnidirectional walking given a desired walking velocity that may be input from a joystick (or other user input device) or an artificial intelligence (AI) planner. This allows a legged robot to walk along an arbitrary path while expressing a custom animation "style," e.g., a happy walk, a sneaky walk, or other manner of walking. The stylized walking motion or gait is generalized by the animation engine from a small number of animation "samples" (accessible in local or remote memory or data storage) that are defined at key walking velocities and tracked using a whole-body controller, which may be implemented as an optimization-based whole-body controller in some cases. The set of samples that are used as input to define a given walking style is authored by an animator using the aforementioned animation editor. In the deployment phase, the animation engine would run on the robot computer. More generally, in the design phase, the animation engine could also run on the robot computer with the animation editor communicating with the engine wirelessly, or on a remote server.

More particularly, a system is provided for designing or generating stylized walking gaits for a legged robot (e.g., a physical bipedal robot or character). The system includes data storage or memory storing, for each of a set of animation styles, a gait walking sample complying with kinematic and dynamic constraints associated with the legged robot at each of a plurality of velocities. The system also includes a processor communicatively linked to the memory. Significantly, the system further includes an animation engine provided by the processor running software. During system operations, the animation engine receives as input a desired velocity for the legged robot, a selection of one of the animation styles, and a robot state for the legged robot or a simulation of the legged robot. With this input, the animation engine generates actuator commands to animate the legged robot or the simulation of the legged robot with a stylized walking gait based on the desired velocity, the selected one of the animation styles, and the robot state.

The animation engine often will include a sample blender providing sample interpolation of the gait walking samples for use in generating the actuator commands, and the sample interpolation can include blending a time-varying subset of the parameters that are constrained based on contact events. In some embodiments of the system, each of the gait walking samples includes a gait parameter vector paired with an associated gait velocity. In these or other embodiments, each of the gait walking samples is defined by a set of parameters including time intervals, attributes, and function curves.

The attributes may include stance splay, stance width, and stance Xbias for the legged robot. The attributes may include translation and rotation curves defined on a cyclic gait interval or left and right swing intervals, and, more specifically, the function curves can be selected from the group of function curves (e.g., with respect to a reference frame such as, but not limited to swing frame, to path frame, or the like) comprising left sole translation, left sole rotation, right sole translation, right sole rotation, pelvis z translation, pelvis rotation angles, left arm joint angles, right arm joint angles, spine joint angles, and neck joint angles.

In some system implementations, the system includes an animation editor provided by the processor running software. The animation editor is configured to generate a graphical user interface (GUI), and wherein the GUI includes a three dimensional (3D) visualizer displaying a 3D model of the simulation of the legged robot animated based on the actuator commands. The GUI can also be used to edit styles on the real robot to adjust styles live for final polishing or modifying of the stylized walking gait or other motion under design. The GUI may be adapted to receive user input modifying at least one of the parameters, the desired velocity, or the selected one of the animation styles. Then, the animation engine, in response, can be configured to generate additional actuator commands, and the animation editor will display, in real time or near real time, a revised 3D model of the simulation of the legged robot animated based on the additional actuator commands, whereby the user of the system is provided immediate feedback on changes they make to a stylized walking gait. Additionally, the animation editor may optionally be used for live editing of stylized gait parameters when interfacing directly with a physical robot. To facilitate design, the user input may include the user modifying one or more waypoints in one of the function curves displayed in the GUI.

DETAILED DESCRIPTION

An animation or robot control system is taught that includes an animation engine and an animation editor. These components are useful for generating control signals (or "animation") for legged robots (e.g., bipedal robots) and, specifically, are used to perform procedural animation for sample-based design of stylized walking gaits with physical constraints. The design and/or control system includes a procedural animation engine and a graphical animation editor that together enable animators to author stylized walking gaits that can be achieved by robotic characters in the form of real robots, e.g., hardware in a robotic system designed to provide a bipedal robot.

Figure 1:
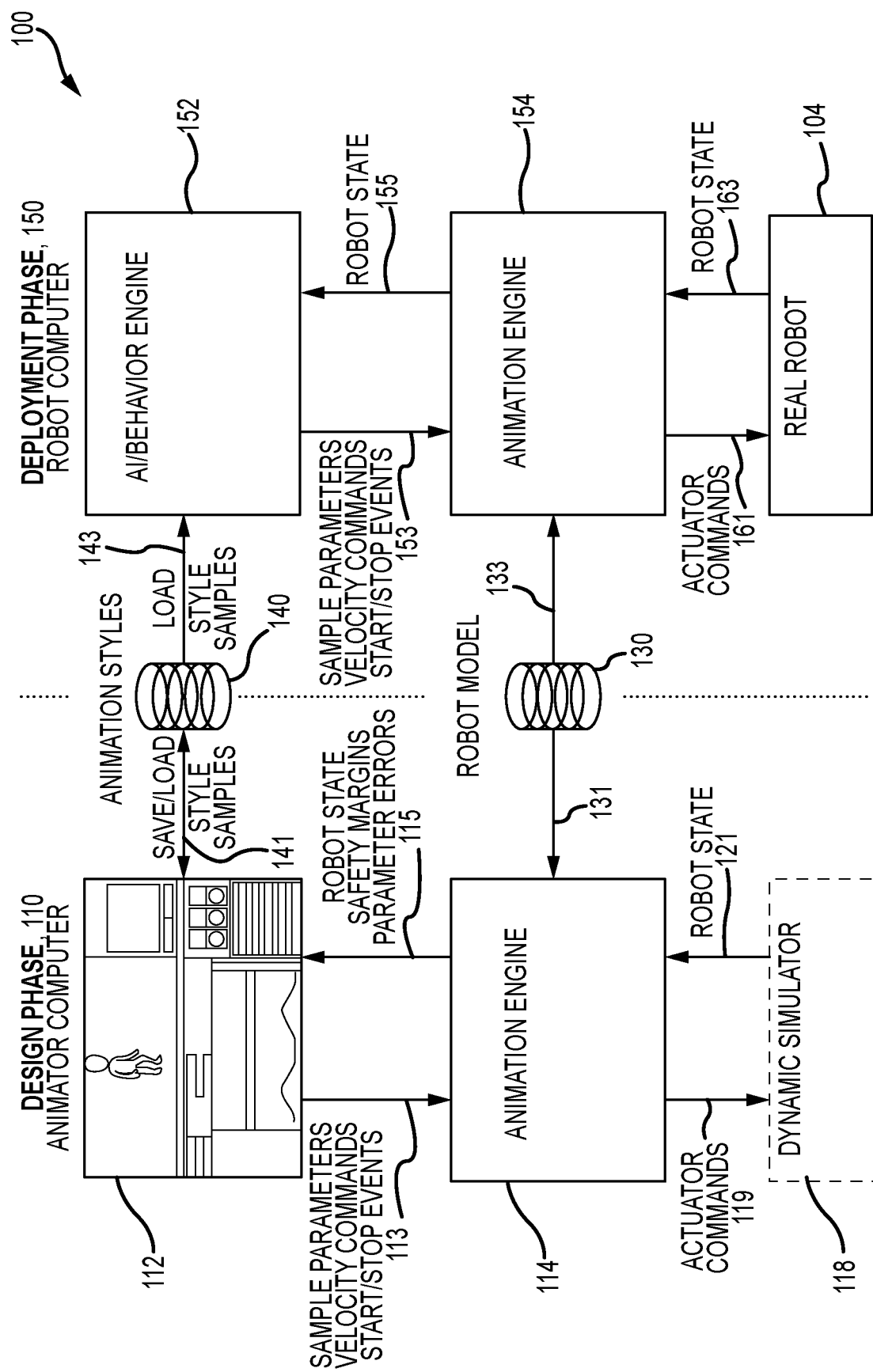
FIG. 1 is a functional block drawing of a robot gait design and control system with an animation engine and an animation editor of the present description.

FIG. 1 illustrates a functional block diagram of a robot design and control system 100 of the present description illustrating data, components, and/or workflow during its operations to generate and deploy a stylized walking gait to a robot 104, which may be a legged robot such as a bipedal robotic character. Particularly, the system 100 is shown with this high-level block diagram to illustrate the walking gait design and deployment workflow that is enabled by the concepts proposed by the inventors including use of an animation editor 112 along with an animation engine 114. The system 100 may be thought of as operating in two phases with the animator/designer computer 110 operating to provide the design phase (left side of FIG. 1) and the robot controller or computer 150 operating to provide the deployment phase (right side of FIG. 1).

In brief, in the design phase, an artist authors walking styles (stored as shown with arrow 141 in animation styles data store/memory 140) by defining sample parameters at key walking velocities using a graphical animation editor 112 (which presents a graphical user interface (GUI) on a display device of the computer 110). In the deployment phase, the sample parameters for each style are loaded (as shown by arrow 143) by an AI/behavior engine 152 that the robot computer/controller 150 runs on the physical robot 104.

In further detail regarding the design phase, an artist uses the graphical animation editor 112 (or interacts with the GUI it produces) to author walking styles stored in memory 140 for a target robot 104. The editor 112 may be a portable software application that runs on a personal computer 110. As the animator interacts with the editor 112, the application sends (as shown with arrow 113) sample parameters, velocity commands, and start/stop events to an instance of the animation engine 114, which generates the stylized whole-body motion for the target robot 104, which is defined by a robot model in memory or data store 130 and retrieved as needed as shown by arrow 131. The editor 112 provides visual feedback to the artist by rendering the current robot state (shown as being provided by the animation engine 114 with arrows 115) using a 3D model of the character (e.g., from model in memory 130).

In one configuration of the system 100, the animation engine 114 computes the robot state by integrating ideal joint accelerations from an optimization-based whole-body controller. This method produces dynamically accurate motion when feasible, but it can violate the dynamic constraints to prevent the character from falling, which is a useful feature early in the design phase. In another configuration of the system 100, the engine 114 sends the optimized actuator commands (as shown with arrow 119) to a dynamic simulator 118 operating to provide a dynamic simulation of the target robot 104, and the simulator 118 strictly enforces the dynamic constraints while producing the robot state (as shown with arrow 121), thereby allowing the animator to fully validate the feasibility of the stylized motion they are authoring via editor 112.

Once the design phase is complete, the artist can save (as shown with arrow 141 into memory 140) the walking style (as defined by a set of samples) with associated metadata, e.g., the style name. The style can then be loaded by the animation editor 112 for further editing or be deployed to the target robot 104. During the deployment phase as carried out by the robot computer 150, the walking style samples are loaded (as shown by arrow 143) by an AI/behavior engine application 152 that runs on the target robot computer/controller 150. This application is responsible for planning the robot's path through the environment and selecting an appropriate walking style based on high-level objectives and/or cues such as emotional state, social cues, or show content. As in the design phase, an instance of the animation engine 154 is again used to generate omnidirectional stylized walking trajectories from the corresponding velocity commands and sample parameters (as shown with arrow 153, with robot state information being passed back as shown with arrows 155 and 163 from the robot 104). However, in this configuration, the animation engine 154 can send the optimized actuator commands (as shown with arrow 161) to a hardware abstraction layer of robot 104 that relays the commands to the robot's drives and returns the corresponding sensor measurements (as shown with arrow 163 in FIG. 1).

With this overview of the system's design and operations in mind, it may be useful now to turn to a discussion of gait design. While a biped's walking gait may vary dramatically as a function of speed, emotion, or personal style, the fundamental mechanics and constraints remain the same. If the subspace of all dynamically feasible walking gaits for a specific biped are considered, the achievable styles are determined by the salient differences among those gaits. This motivates the need for design tools that abstract the common complexities of walking gaits and allow artists/designers to focus on the critical features that distinguish one style from another. This is especially important when designing gaits for physical robots, as it is generally impossible to ensure dynamic feasibility of an animated motion without automating some portion of the design process or post-processing the motion.

Figure 2:
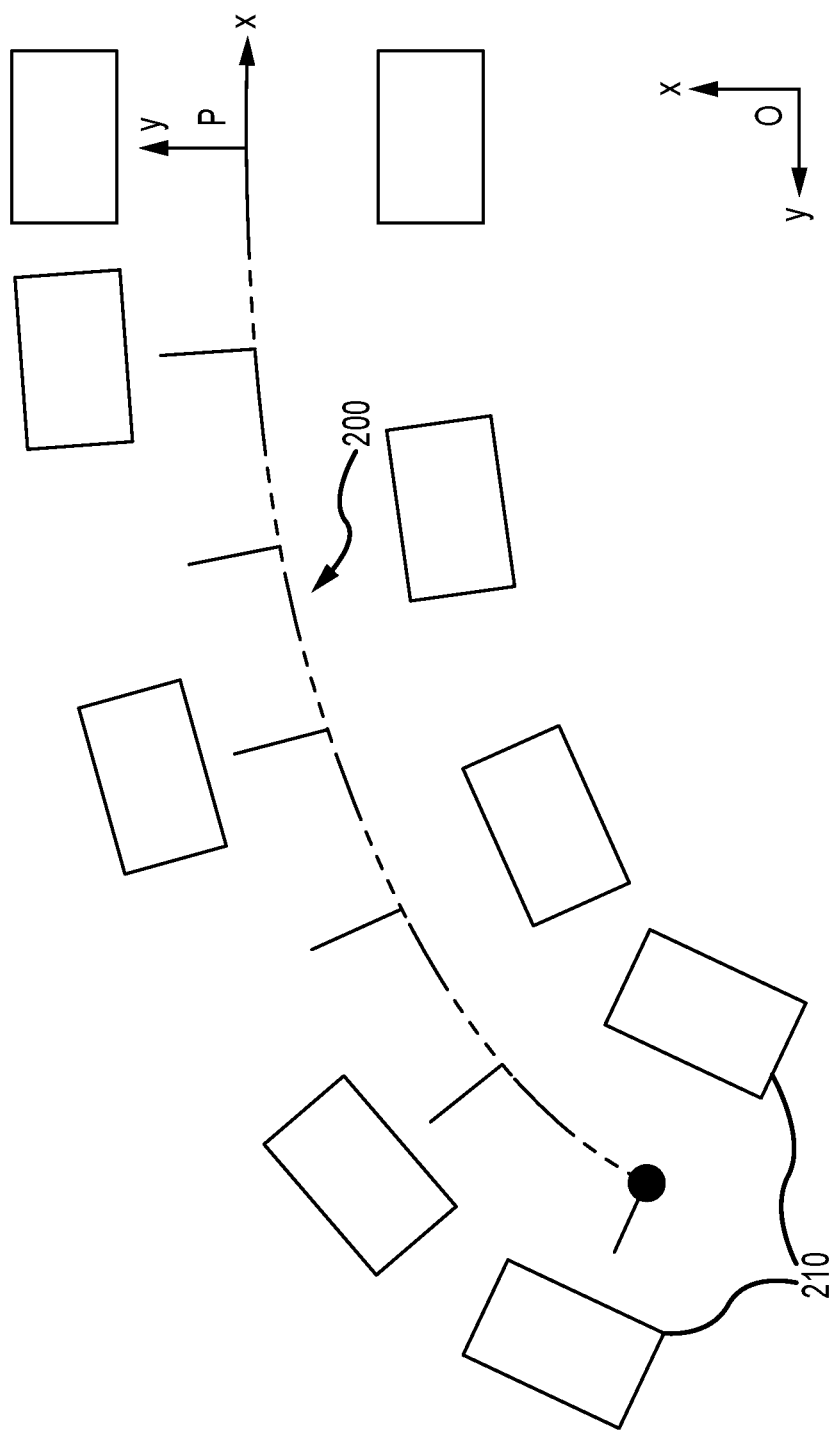
FIG. 2 illustrates an exemplary walking path with footholds for a bipedal robot.

With regard to gait velocity, procedural locomotion planners are most commonly designed to track a desired planar velocity signal, $v=[\dot{x}\ \dot{y}\ \dot{\theta}]^T$, provided by a user or high-level AI. By convention, v is typically expressed in body coordinates, where $\dot{x}$, $\dot{y}$, and $\dot{\theta}$ represent the desired forward, lateral, and angular velocity, respectively. The integral of the time-varying velocity trajectory determines the expected path of the biped through the environment. Accordingly, a "path frame", $P \in SE(2)$, can be defined whose coordinates are the integral of the input velocity vector. FIG. 2 provides an illustration of an example walking path 200 with footholds 210, with the path and origin frames being labeled P and O, respectively. Note that, by the convention used, the x-axis of the path frame is aligned with the front of the robot and y-axis to the left. The path pose is given by the vector, $p=[x\ y\ \theta]^T$, where $\theta$ represents the robot's counterclockwise rotation relative to an inertial origin frame, O.

Figure 3:
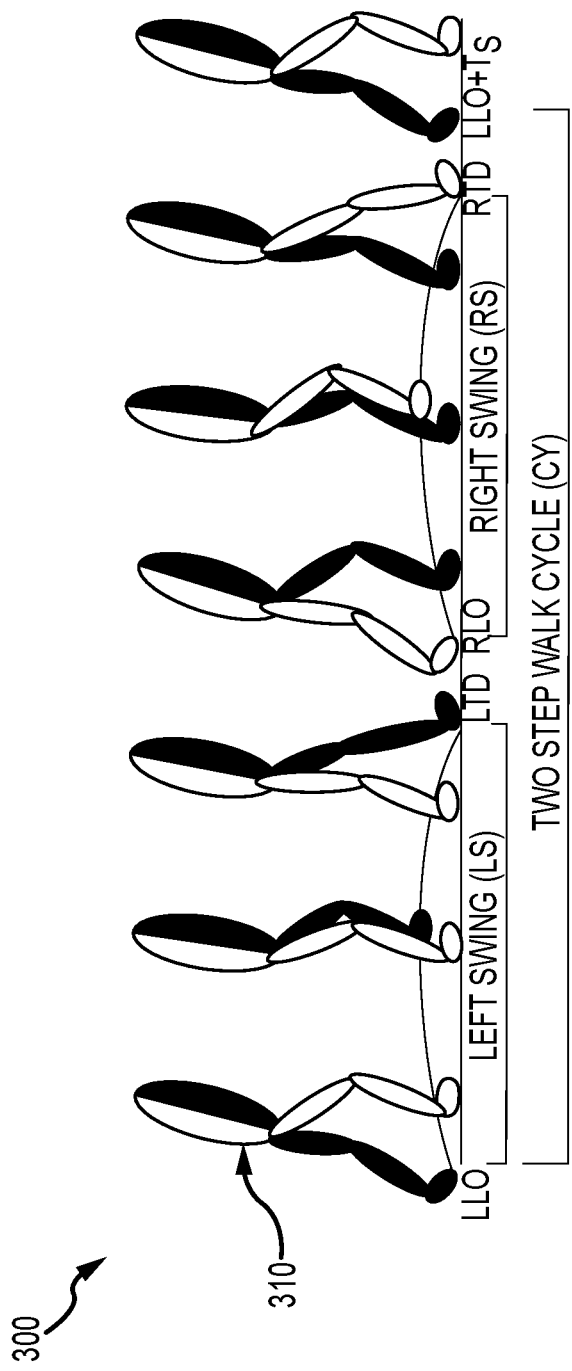
FIG. 3 is a diagram showing a two-step walk cycle for a bipedal robot.

With regard to walk cycle, a bipedal walking gait is typically defined by a sequence of alternating steps with a double support phase between them, e.g., a time interval where both feet are in contact with the ground. This excludes flight phases as in jogging or running gaits. FIG. 3 provides a diagram 300 of a two-step walk cycle for bipedal robot 310. The gait transitions through four contact events during each cycle: left liftoff (LLO), left touchdown (LTD), right liftoff (RLO), and right touchdown (RTD). For the purposes of this description, the two-step cycle is defined such that it starts and ends at LLO. Note that the left swing interval begins at LLO and ends at LTD, while the right swing interval begins at RLO and ends at RTD. When walking at a constant velocity, the gait is assumed to be periodic, and the cycle ends at the following LLO event when the robot returns to the initial configuration having translated some distance determined by the cycle period, $T_S$, and gait velocity.

In reference now to gait sampling, as the velocity varies, the walk cycle should change to accommodate different step timings and/or stride lengths. Additionally, distinct gait features may emerge with changes in speed, e.g., a more pronounced arm swing while walking at a fast pace. It is common practice then to animate several "sample" walk cycles at key velocities when designing a stylized gait. These samples are interpolated to generate whole-body walking trajectories consistent with an arbitrary gait velocity.

In character control applications, e.g., for game design, walk samples are typically defined as cyclic joint-space animation trajectories that define the full joint configuration of a rigid body character model, e.g., $q(t) \forall t \in (0, T_S)$. The joint-space animations are blended using animation graphs, blend trees, or other interpolation methods, and the floating base coordinates are transformed by the path frame to track a desired gait velocity. As the animator is responsible for prescribing the full configuration of the robot as a function of time, these methods typically do not enforce kinematic or dynamic constraints on the walk samples or interpolated motion.

Alternatively, walking gaits can be defined parametrically, such that the joint configuration evolves over time as a function of a gait parameter vector, H, and the gait velocity, which can be given as:

$$q(t) = f(\Pi, v, t) \qquad \text{Eq. (1)}$$

Here, the parameter vector encodes the salient features of the desired walking motion, which are typically translated into whole-body walking trajectories by a procedural planner. Once again, it is natural for the gait parameters associated with a given style to vary as a function of velocity. Following the sample-based design approach, an artist can define a full walking style by designing a unique parameter vector, $\Pi_s$, for several key velocities, $v_s$. Unlike traditional animation methods, this approach allows constraints to be enforced by the procedurally generated motion. For the remainder of this description, the term "sample" will be used to refer to a gait parameter vector paired with an associated gait velocity, i.e., $(\Pi_s, v_s)$.

Turning now to sample parameterization, the inventors propose a unique gait parameterization that aids the rapid design of feasible and expressive walk cycles for robotic characters. Ideally, a suitable set of gait parameters should strike a balance between several competing design objectives such as maximizing the expressive range of valid gaits, minimizing the number of design parameters, and minimizing the expected design time. To be deployed to a physical robot, an animated walk cycle must also satisfy certain kinematic and dynamic constraints. Referring again to FIG. 3, the contact events should follow the appropriate gait sequence, and the soles of the feet should never penetrate the ground plane or slip during contact. As a necessary condition for dynamic feasibility, the center of pressure (CoP) should also lie inside the active support polygon at all times.

The inventor-proposed parameterization includes the following three data types that can be edited during the design phase: (a) time intervals; (b) attributes; and (c) function curves. Time intervals are defined by a minimum value and a maximum value relative to the start of the walk cycle. The following are exemplary time intervals: (1) a CY time interval involving a two-step cycle interval with minimum and maximum of LLO and LLO+$T_S$; (2) an LS time interval involving the left swing interval with minimum and maximum of LLO and LTD; and (3) an RS time interval involving the right swing interval with minimum and maximum of RLO and RTD. Each configurable limit maps to a contact event in the walk cycle. The minimum values of the CY and LS intervals are clamped to zero. The limits are also constrained to satisfy the event ordering illustrated in FIG. 3, e.g., LLO<LTD<RLO<RTD<LLO+$T_S$, and a lower bound is enforced on the distance between each event time based on the minimum permissible durations of the single and double support phases.

Figure 4:
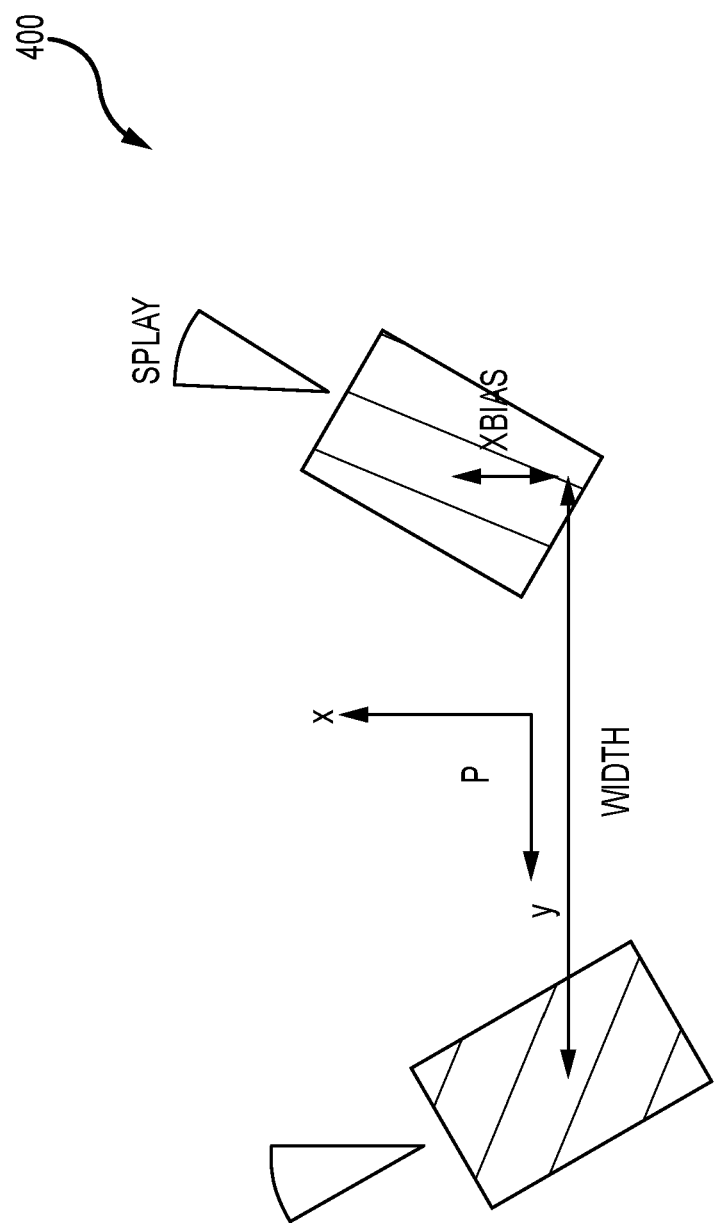
FIG. 4 is a diagram showing exemplary stance attributes to animate or control a robot with left and right footholds being shown for a double support phase assuming zero velocity along with the path frame, P.

Attributes are configurable constants that affect some aspect of the walk cycle. The following are three exemplary attributes that determine foothold placement: (1) stance splay defines a mean angular offset between left/right (L/R) footholds; (2) stance width defines a mean lateral offset between L/R footholds; and (3) stance Xbias defines a mean forward offset between L/R footholds. The stance splay, width, and Xbias attributes determine the mean angular, lateral, and forward offset between the left and right footholds relative to the path frame. FIG. 4 illustrates with diagram 400 the effect of each attribute on the robot's stance when the gait velocity is zero. The stance footholds are symmetric about the path frame. In general, the active footholds are determined by sampling and transforming the path pose at touchdown time (LTD or RTD). An example foothold sequence derived from the walking path and stance attributes is shown in FIG. 2. The inventor-proposed parameterization enables a wide range of expression including narrow-stanced, wide-stanced, duck-footed, pigeon-toed, and limp-like gaits while preventing the animator from having to manually define the foothold poses, which can be a tedious and time-consuming process.

Function curves are time-varying trajectories that describe the kinematic motion of the cycle walk. The following are exemplary core functions used to animate a stylized walk in the described system: (1) Left Foot Tz/Ty/Tx defining left sole translation with respect to swing frame; (2) Left Foot Rz/Ry/Rx defining left sole rotation with respect to swing frame; (3) Right Foot Tz/Ty/Tx defining right sole translation with respect to swing frame; (4) Right Foot Rz/Ry/Rx defining right sole rotation with respect to swing frame; (5) Pelvis Tz defining pelvis z translation with respect to path frame; (6) Pelvis Rz/Ry/Rx defining pelvis rotation angles with respect to path frame; (7) Left Arm [Joint] defining left arm joint angles; (8) Right Arm [Joint] defining right arm joint angles; (9) Spine [Joint] defining spine joint angles; and (10) Neck [Joint] defining neck joint angles.

Figure 5:
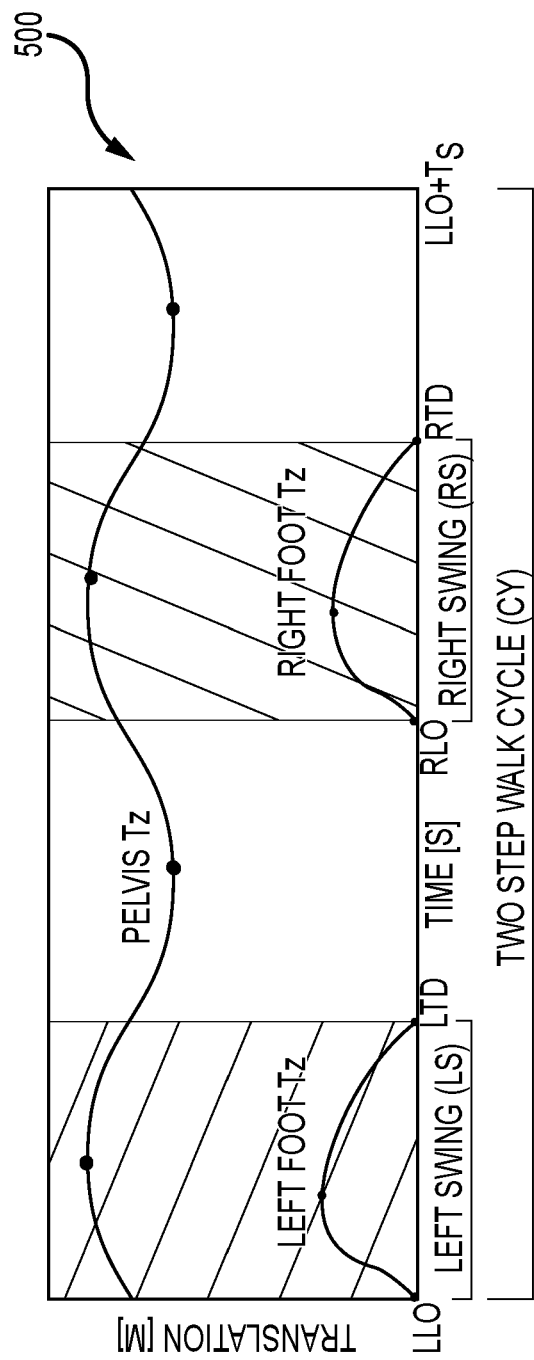
FIG. 5 is a graph illustrating exemplary pelvis, left foot, and right foot function curves for a two-step cycle.

Each curve is defined on a specific time interval, e.g., the periodic cycle interval, CY, or discrete swing intervals, LS or RS as illustrated in the graph 500 in FIG. 5 showing exemplary Pelvis Tz, Left Foot Tz, and Right Foot Tz function curves for a two-step cycle. Pelvis functions are defined on the full two-step cycle, while left and right foot functions are defined on the left and right swing intervals, respectively. The functions can be parameterized as cubic splines to enable traditional curve editing, where an artist shapes the function using knot position and tangent controls (e.g., in the animation editor GUI described above).

Left and right foot translation and rotation curves are defined for each swing interval, allowing an artist to shape the swing trajectory during stepping. These parameters define the time-varying pose of the sole relative to a procedurally generated swing frame, $S(t) \in SE(3)$. The swing frame follows a nominal swing trajectory, smoothly interpolating from the initial foothold pose at liftoff to the final foothold pose at touchdown. The initial and final values of the swing interval function curves are clamped to zero to ensure that the swing foot trajectory starts and ends at the correct liftoff and touchdown pose. The pelvis translation and rotation curves define the height and orientation of the robot's pelvis link relative to the path frame. These curves are defined on the full two-step cycle interval along with joint-space function curves for the left arm, right arm, spine, and neck chains. Periodic boundary constraints are enforced on these functions so that the interpolated trajectories are C1 continuous as the walk cycle loops.

The inventor-proposed parameterization does not include the horizontal pelvis translation, i.e., Pelvis Tx/Ty. The pelvis translation is strongly correlated with the center of mass (CoM) of the robot, which is critical for dynamic balance. By leaving these degrees of freedom unconstrained, the translation can be optimized by a dynamic planner that attempts to keep the CoP inside the active support polygon as described above. Due to the complexity of the multibody dynamics, this constraint can be extremely difficult for an artist to satisfy via manual curve editing.

At this point in the description, it may be useful to describe sample interpolation as carried out within the new system. In order to generalize a sampled walking style to arbitrary gait velocities, it is useful to define a method to interpolate the sample parameters. The inventors created a novel interpolation strategy that uses a gait "phase map" to blend time-varying parameters that are constrained based on the contact events. By blending the sample parameters as opposed to the corresponding joint trajectories, the interpolation process ensures that the resulting whole-body motion satisfies the constraints imposed on the original samples.

Figure 6:
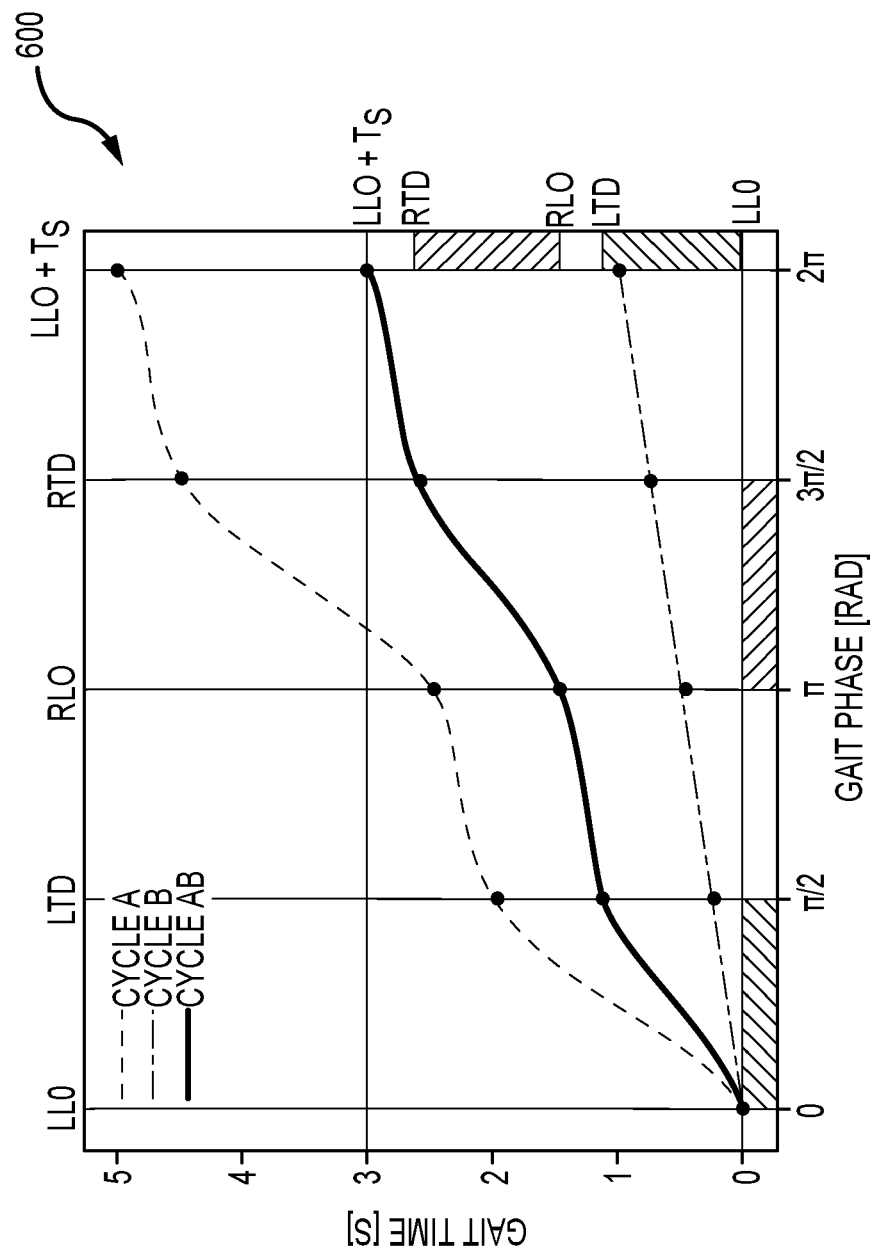
FIG. 6 is a graph illustrating phase maps for two gait cycles along with the blended cycle provided by sample interpolation of the present description.

In the sample interpolation, a "phase map" is created for a two-step walk cycle. A phase map is an invertible function that maps a generic "gait phase," $\phi$, to a unique "gait time," t, specific to each walk cycle. The mapping is defined such that the cycle event times, LLO, LTD, RTO, RTD, and LLO+$T_S$, correspond to phase values of 0, $\pi/2$, $\pi$, $3\pi/2$, and $2\pi$. A smooth phase map, $\Omega(\phi)$, is derived by fitting a monotonic cubic spline to the corresponding phase/time waypoints as illustrated in the graph 600 of FIG. 6, which provides some example walk cycles. Particularly, the graph 600 provides phase maps for two gait cycles, A and B, along with the blended cycle, AB, with a blend ratio of $\alpha$=0.5.

It may now be useful to consider the problem of associating a specific gait time, $t_A$, from cycle A, with an "equivalent" gait time, $t_B$, from cycle B. Using the respective phase maps, $\Omega_A(\phi)$ and $\Omega_B(\phi)$, the solution is given by $t_B = \Omega_B(\Omega_A^{-1}(t_A))$. Note that this method guarantees that contact event times, e.g., LTD, will always map to the equivalent event time in another cycle. This property of the chosen phase map preserves contact event-based timing constraints when mapping gait signals from one cycle to another.

Given two samples, A and B, an interpolated parameter set, $\Pi_{AB}$, can be computed by blending the individual attributes, time intervals, and function curves according to a desired blend ratio, $\alpha \in (0,1)$. The result is a valid sample associated with an intermediate velocity. Attributes such as the stance width may be interpolated using a simple alpha blend that can be given as:

$$r = (1-\alpha)r_A + \alpha r_B \qquad \text{Eq. (2)}$$

where $r_A$ and $r_B$ are the associated sample values. Similarly, the interpolated time intervals are computed by alpha blending the minimum and maximum values independently. Because the blend operation is a convex combination, it can be shown that the ordering constraints imposed on the sample event times are preserved by the blended outputs.

In order to blend the function curve parameters, the phase map, $\Omega_{AB}(\phi)$, is first evaluated for the interpolated walk cycle based on the blended time intervals. Then, the blended function curve can be evaluated at an arbitrary gait time using the following algorithm: (1) Compute the equivalent gait phase, $\phi = \Omega_{AB}^{-1}(t)$; (2) Compute the equivalent gait time for sample A, $t_A = \Omega_A(\phi)$; (3) Compute the equivalent gait time for sample B, $t_B = \Omega_B(\phi)$; (4) Evaluate function curve A at $t_A$; (5) Evaluate function curve B at $t_B$; and (6) Interpolate the resulting values using Eq. 2. The full discretized function curve can be evaluated over the domain of the associated time interval by repeated application of this algorithm. However, the blended function value typically only has to be evaluated at the current gait time when generating a procedural gait.

Turning now to velocity-based sample interpolation, to generate omnidirectional gaits that span the full range of achievable walking velocities, the inventors formulated a sampling and interpolation algorithm that relies on a set of walk samples defined at a plurality of velocities. In one embodiment, nine key velocities were selected for use in walk sample definition (provided in the following by name and for sample velocities in each direction $\dot{x}$, $\dot{y}$, and $\dot{\theta}$): (1) Forward Fast ($\dot{x}_{max}$, 0, and 0); (2) Forward Slow ($\dot{x}_{slow}$, 0, and 0); (3) Step in Place (0, 0, and 0); (4) Reverse Slow ($-\dot{x}_{slow}$, 0, and 0); (5) Reverse Fast ($-\dot{x}_{max}$, 0, and 0); (6) Left Strafe (0, $\dot{y}_{max}$, and 0); (7) Right Strafe (0, $-\dot{y}_{max}$, and 0); (8) Left Turn (0, 0, and $\dot{\theta}_{max}$); and (9) Right Turn (0, 0, and $-\dot{\theta}_{max}$). Here, $\dot{x}_{max}$, $\dot{y}_{max}$, and $\dot{\theta}_{max}$ represent the maximum achievable velocity in each direction for a given style, while $\dot{x}_{slow}$ represents a "slow" walking speed used to differentiate the gait style when walking at slow and fast speeds.

Figure 7:
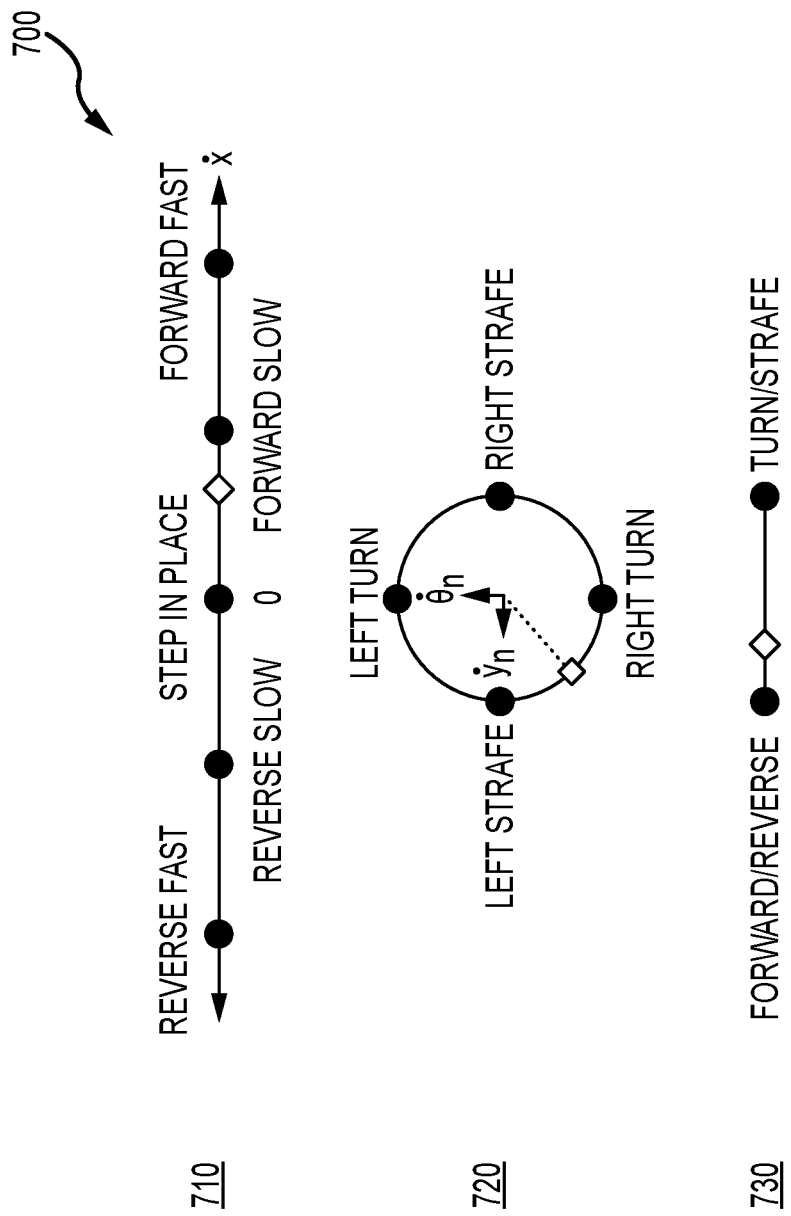
FIG. 7 illustrates diagrammatically a three-step process for omnidirectional sample interpolation according to the present description.

Given these nine samples, the interpolated gait parameters can be evaluated for any arbitrary input velocity, $v = [\dot{x}\ \dot{y}\ \dot{\theta}]^T$, using a three step process 700 illustrated in FIG. 7. In each step, the white diamond represents the input velocity while each black circle represents a different sample velocity mapped to the relevant blend space. In step 710 and step 720, the nearest forward/reverse and turn/strafe samples are blended, respectively. In step 730, the intermediate results are blended to produce the final interpolated parameter set.

In the first step 710, the forward, reverse, and in place samples are interpolated by blending the two nearest neighbor samples based only on the value of x. To this end, $\dot{x}_A$ and $\dot{x}_B$ can be used to represent the x velocity of the two nearest forward/reverse samples, A and B. The blend ratio can then be computed based on the distance from each sample velocity as:

$$\alpha_{\dot{x}} = f_{soft}((\dot{x} - \dot{x}_A)/(\dot{x}_B - \dot{x}_A)) \qquad \text{Eq. (3)}$$

where $f_{soft}(\alpha) = -2\alpha^3 + 3\alpha^2$ is a cubic polynomial that maps the unit domain to the unit range but with a first derivative of zero at both limits. This ensures that there are no discontinuities in the first derivatives of the blended sample parameters when the input velocity crosses into a new region of the sample space.

In the second step 720, the turn and strafe samples are interpolated based on the values of $\dot{\theta}$ and $\dot{y}$. First, the velocities are normalized based on the maximum values defined in the set of omnidirectional sample velocities described above, e.g., $\dot{\theta}_n = \dot{\theta}/\dot{\theta}_{max}$ and $\dot{y}_n = \dot{y}/\dot{y}_{max}$. Then, the equivalent polar coordinates, $\beta = \alpha\tan 2(\dot{y}_n, \dot{\theta}_n)$ and $\rho = \dot{y}_n^2 + \dot{\theta}_n^2$, are computed. The four turn and strafe samples lie on the unit circle in this normalized space and map to $\beta = 0$, $\pi/2$, $\pi$, and $3\pi/2$. Similar to the forward/reverse case, the two nearest neighbors among the turn/strafe samples can be computed and then blended using the following ratio:

$$\alpha_\beta = f_{soft}((\beta_A - \beta)/(\beta_B - \beta_A)) \qquad \text{Eq. (4)}$$

where $\beta_A$ and $\beta_B$ are the corresponding polar angles of the samples.

Steps 710 and 720 produce a blended forward/reverse sample and a blended turn/strafe sample, respectively. In the third step 730, these two intermediate samples are blended based on the relative norms of $\dot{x}_n = \dot{x}/\dot{x}_{max}$ and $[\dot{y}_n \dot{\theta}_n]^T$. The final blend ratio can then be given by:

$$\alpha_{turn-strafe} = f_{soft}(\min(\rho,1)) \cdot (1 - \gamma f_{soft}(|\dot{x}_n|)) \quad \text{Eq. (5)}$$

where $\gamma \in (0, 1)$ is an adjustable gain. When $\dot{x}$ is zero, the first term in the product fully determines the ratio at which the turn-strafe sample is blended into the final result. As $\dot{x}$ approaches the maximum forward/reverse velocity, however, the second term in the product effectively scales the ratio by $(1-\gamma)$ to reduce the influence of the turn-strafe samples.

As discussed earlier, the walking gait design system includes an animation engine and an animation editor to provide a large portion of its functions used to create and edit stylized walking gaits with physical constraints. The animation engine is a procedural motion planner and whole-body controller that enables stylized omnidirectional walking using the sample parameterization and interpolation method described above. The controller generates actuator commands for a simulated or physical robot in real time to achieve a desired gait velocity provided by a user or high-level AI. While the sample parameterization used to encode the walking styles is based on a periodic two-step cycle, the animation engine is designed to track time-varying input velocities. This allows a bipedal robot to walk along an arbitrary path and adapt its speed and direction in real time. In general, the resulting gait will only be periodic when the commanded velocity is constant.

Figure 8:
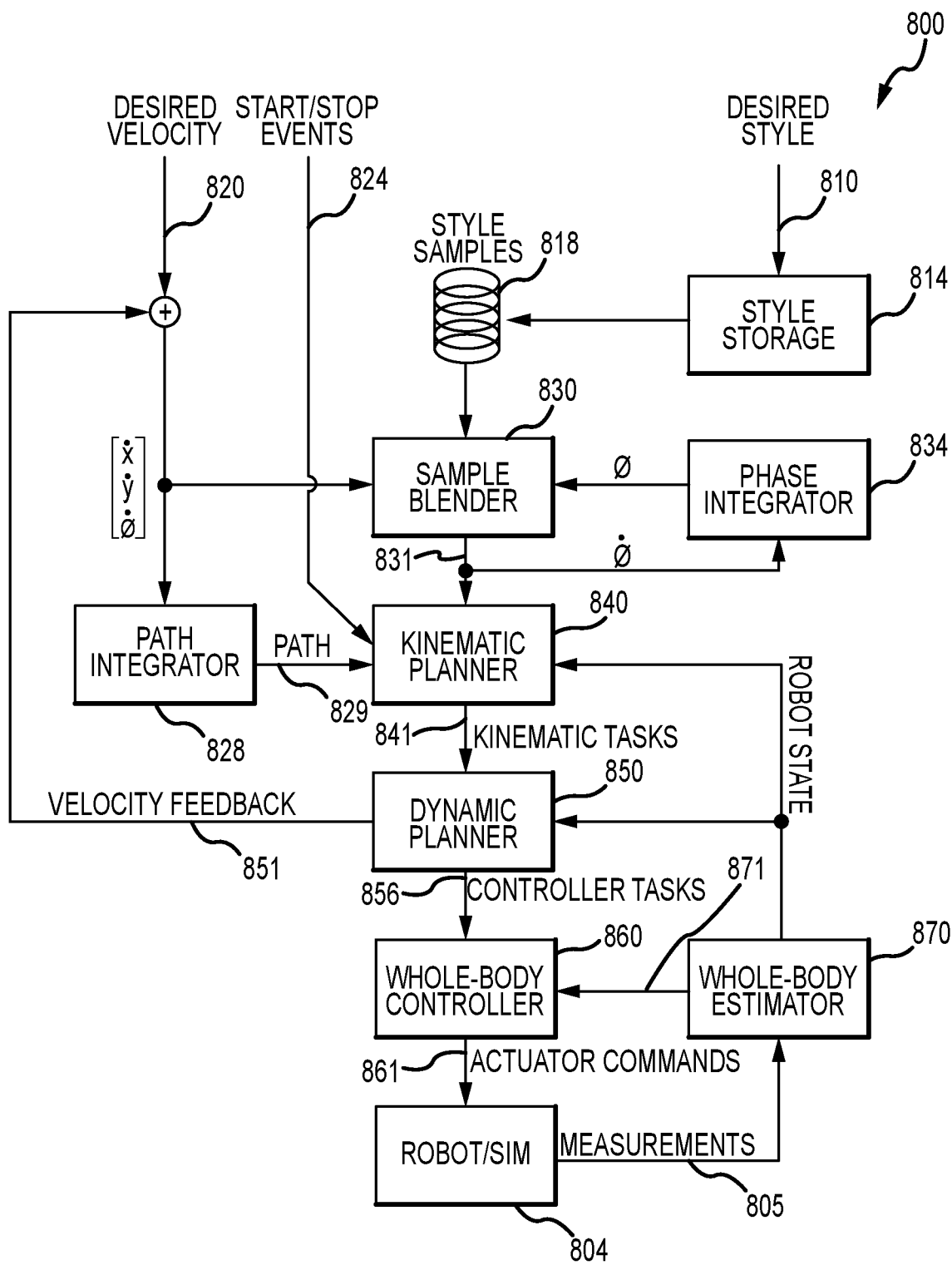
FIG. 8 is a functional block diagram of an animation engine of the present description such as may be used in the system of FIG. 1.

FIG. 8 illustrates a high-level block diagram 800 of an exemplary animation engine for use in the systems of the present description including system 100 of FIG. 1. In some embodiments, a message-based API is exposed to allow a client to send desired velocity commands (as shown by arrow 820), set and edit walk styles (as shown by arrow 810), and trigger start and stop events (as shown by arrow 824) to transition from standing to walking and vice versa. The major software components of the engine 800 are described below.

The animation engine 800 includes style storage 814. Particularly, the engine 800 maintains a database of walk styles, which can be stored in memory/data storage 814, and that can be edited at runtime using the client API. Each style includes the nine walk samples, as shown at 818 in FIG. 8, that were described in detail above along with associated metadata including a style name. In the typical workflow, the client or artist/designer inserts multiple styles into the database at startup. The desired walk style can then be selected, as shown by arrow 810, by name to modify the walking gait of the physical and/or the simulated robot 804. During the design phase or mode of system operations, the active sample parameters can also be edited online to provide instant feedback to the animator (e.g., via generation of new actuator commands to control a simulated robot 804 displayed in an animation editor GUI).

The animation engine 800 is further shown to include a sample blender 830. Given a desired walking velocity (as shown being input at 820), the sample blender 830 interpolates the samples 818 using the algorithm described above. The function curves are evaluated at the gait time associated with the current gait phase, $\phi$. The blended sample parameters are passed to the kinematic planner 840, as shown by arrow 831, which is responsible for computing a set of kinematic tasks 841 to achieve the interpolated walk cycle.

The phase integrator 834 of the engine 800 advances the current gait phase at each time step to progress through the gait cycle. As the gait velocity varies over time, the time intervals associated with the blended gait parameters will also fluctuate. As a result, integrating the gait time based on a wall clock can cause the gait phase signal to become non-monotonic. This can result in undesired behavior as the contact event sequence may temporarily reverse. To solve this problem, the gait phase can instead be integrated based on the phase rate, $\rho$, derived from the phase map of the blended sample. The updated gait time can then be evaluated from the phase map.

A path integrator 828 is included in the engine 800 to compute the pose of the path frame at each time step by integrating the desired gait velocity signal (shown by arrow 820). The path integrator 828 also is configured to extrapolate the expected walking path under the assumption that the gait velocity will remain constant in the future. The extrapolated walking path is passed, as shown by arrow 829, to the kinematic planner 840 to evaluate the upcoming foothold poses. More particularly, the kinematic planner 840 maps the sample parameters to a desired footstep plan and a set of task-space objectives for the pelvis, feet, and upper body joints based on the parameter definitions described above, with additional input including the robot state as shown at 871 being received from a whole-body estimator 870 and with its output (e.g., kinematic tasks) being passed to a dynamic planner 850. A finite state machine can be implemented to transition between the double support and single support phases based on the current gait phase. The planner 840 also handles transitions to and from standing, which are initiated by start/stop events 824 received from the client.

The animation engine 800 also includes a dynamic planner 850 that receives the kinematic tasks 841 along with the robot state 871 as input and generates a set of controller tasks 856 that are passed to a whole-body controller 860 as well as velocity feedback 851 that is processed by the path integrator 828 in conjunction with the desired velocity 820. The dynamic planner 850 is adapted to compute desired center of mass and center of pressure trajectories based on the current kinematic plan 841 and robot state 871. This is accomplished in some embodiments using a model-based optimization that attempts to stabilize the CoM while ensuring that the CoP satisfies the contact constraints.

Figure 9:
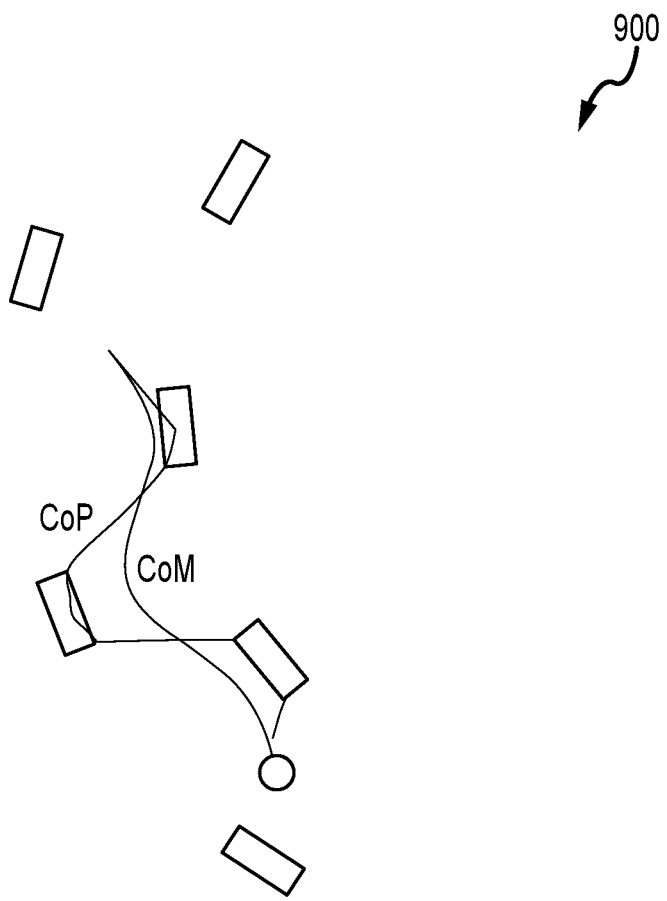
FIG. 9 is a diagram showing optimized CoM and CoP trajectories, given desired footstep sequence and gait timings, that may be output by a dynamic planner, which may be provided as a component of an animation engine of the present description.

FIG. 9 provides a diagram 900 that illustrates an example footstep plan along with the optimized CoM and CoP trajectories output by the dynamic planner 850 given a desired footstep sequence and gait timings. The current kinematic and dynamic tasks are combined to produce a final set of controller objectives that are passed, as shown with arrow 856, to the whole-body controller 860. If the whole-body controller 860 is unable to sufficiently track the desired CoM, e.g., if there is an unexpected disturbance, the dynamic planner 850 can be configured to adjust the desired gait velocity by computing a feedback signal, as shown with arrow 851, that can be used to stabilize the gait by adjusting the upcoming footholds in the direction of a disturbance, e.g., in the event that the robot is pushed while walking.

The whole-body controller 860 is responsible for computing the desired actuator commands to track the kinematic and dynamic tasks from the motion planners 840 and 850. State feedback control, as shown with arrows 871, is used to compute the desired whole-body momentum rate of change and task-space accelerations for the joints and links. These objectives are passed, in some cases, to an optimization-based inverse dynamics solver that computes the desired joint torques, accelerations, and ground reaction forces subject to Coulomb friction constraints and joint acceleration limits. The setpoints and feedforward torques are then translated into actuator commands which are relayed to the simulated or physical robot 804, as shown by arrow 861. The whole-body estimator 870 is adapted to compute the current robot state, provided as feedback to components 840, 850, and 860 as shown by arrows 871, based on the sensor measurements, as shown by arrow 805, from the simulated or physical robot 804. The robot state 871 may include the pose and twist of the floating bask link, i.e., the pelvis, and the position and velocity of each joint.

Figure 10:
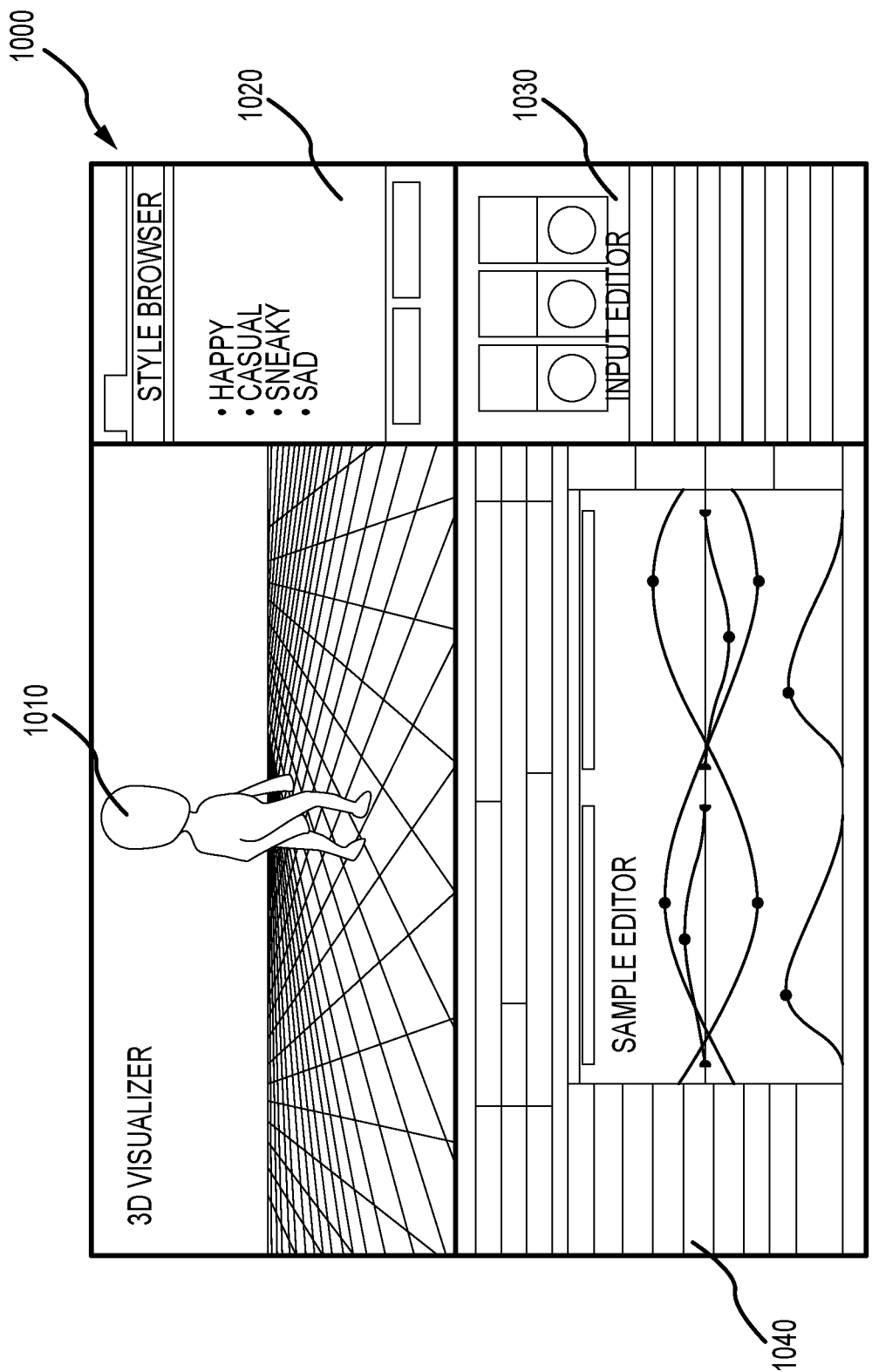
FIG. 10 illustrates a screenshot of an exemplary graphical user interface for the animation editor of the present description.

The animation editor (e.g., editor 112 in FIG. 1) generates or interacts with an animator or client via a graphical user interface (GUI). This GUI allows artists to design custom walking styles for the animation engine. FIG. 10 illustrates an exemplary screenshot 1000 of the GUI provided by the animation editor software. As shown, the GUI 1000 may include a number of regions or sections to facilitate data input and real-time feedback including a 3D visualizer 1010, a style browser 1020, an input editor 1030, and a sample editor 1040. The visualizer 1010 displays a 3D model of the target robot for visual feedback. The style browser 1020 allows the user to load and save various walking styles. The input editor 1030 provides an interface to adjust the desired gait velocity, and the sample editor 1040 includes controls to facilitate modifying a style by editing individual sample attributes, time intervals, and/or function curves. When designing a gait, an animator can toggle the application interface 1000 between an edit mode and a test mode that are each described in more detail below.

In the edit mode of the GUI 1000, the user can select a desired sample for the current walking style and edit its parameters. The 3D window/visualizer 1010 displays a live view of the character walking at the corresponding sample velocity with the periodic two-step gait cycle computed by the animation engine. The animation is updated in real time to reflect changes in a sample parameter. This allows the animator to quickly visualize the effect of varying the value of an attribute, time interval, or a waypoint on a function curve (e.g., via inputs provided in the sample editor 1040).

Figure 11:
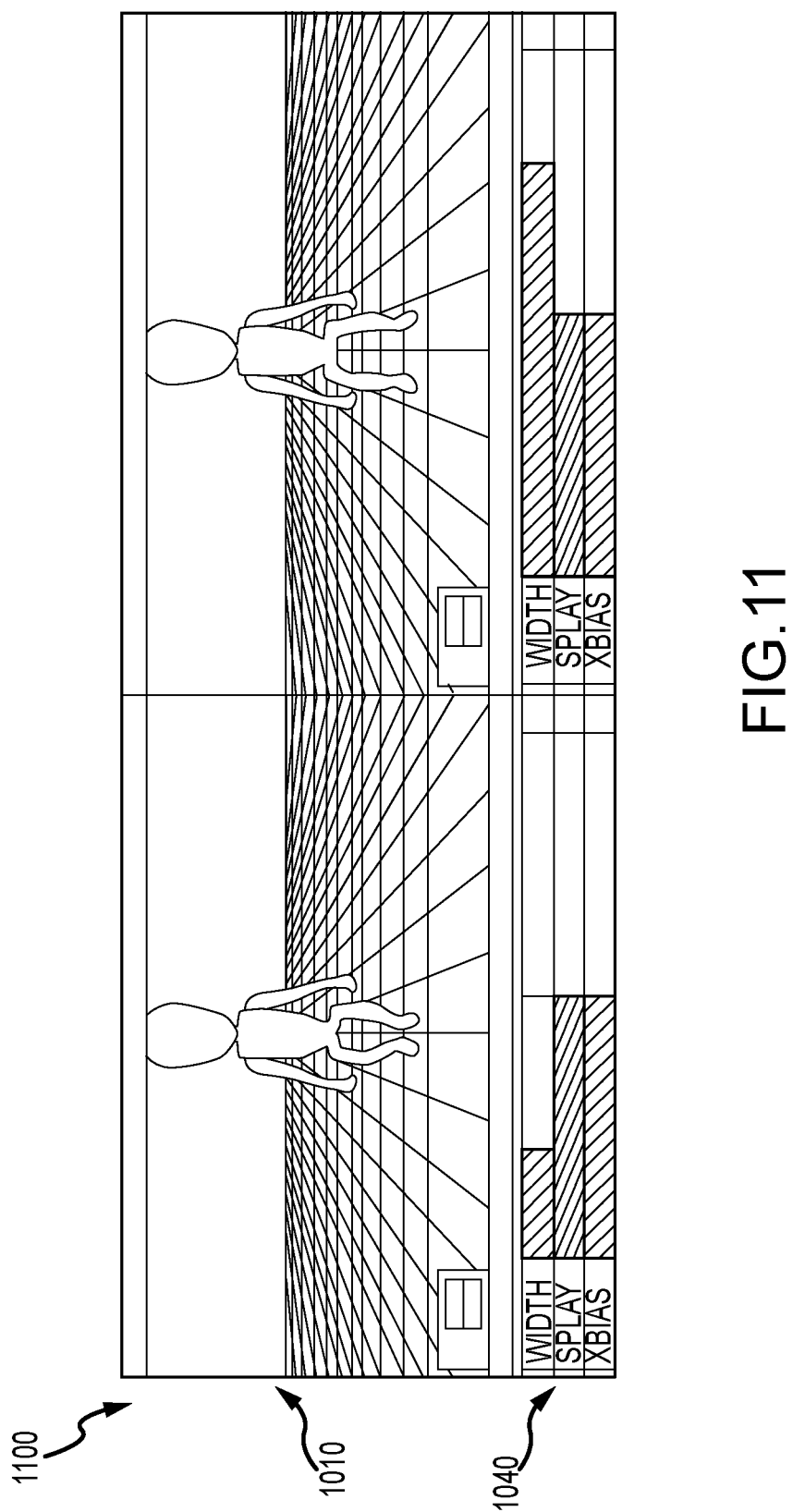
FIGS. 11-13 illustrate partial screenshots of the user interface of FIG. 10 illustrating controls for editing the parameters of attribute, time interval, and function curve types.
Figure 12:
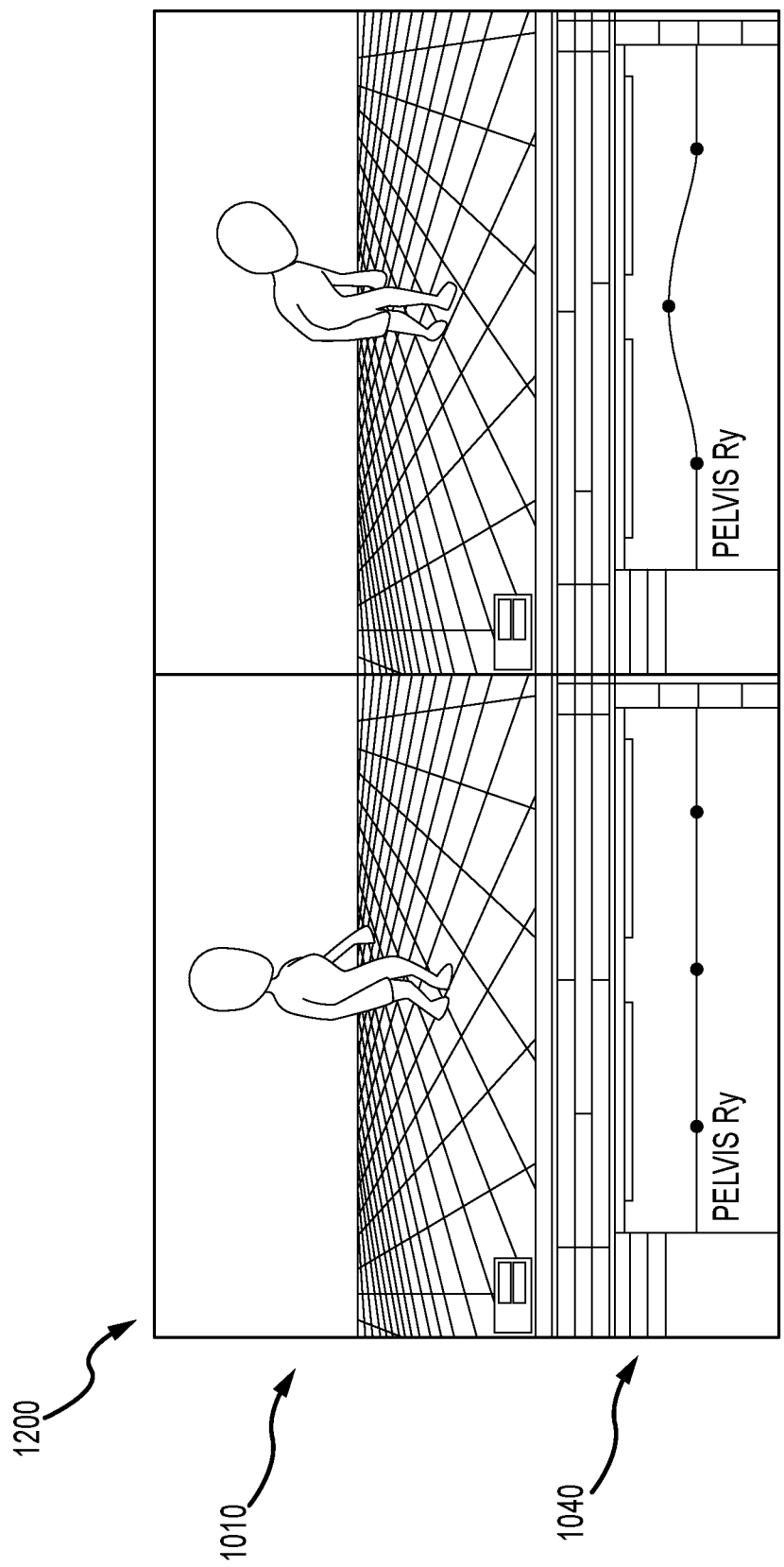
Figure 13:
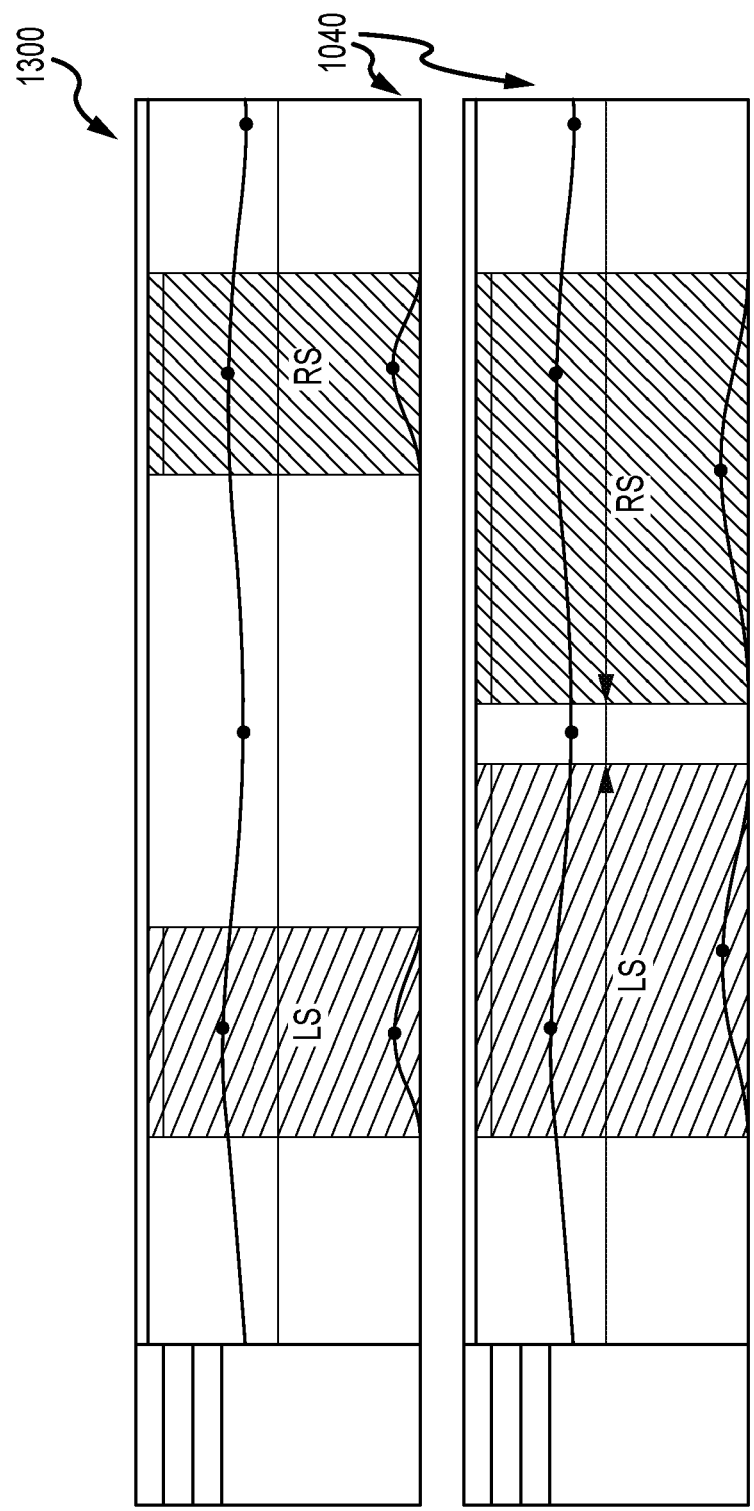

The controls for editing the three types of parameters are illustrated in the partial screenshots 1100, 1200, and 1300 of the animation editor GUI. Particularly, the screen shot(s) 1100 of FIG. 11 illustrates in 3D visualizer window 1010 a live view of a simulation of target robot before (left) and after (right) editing the stance width attribute using a slider control provided to the user in sample editor window 1040. The effect of the widened stance can be seen in FIG. 11 during double support. The screen shot(s) 1200 of FIG. 12 illustrates in 3D visualizer window 1010 a live view of a simulation of a target robot before (left) and after (right) editing the waypoints for the Pelvis Ry function curve, which is provided to the user for manipulation in sample editor window 1040. The effect of the increased pelvis pitch can be seen in FIG. 12 at the beginning of the right swing phase. The screen shot(s) 1300 of FIG. 13 illustrates the sample editor window before (top) and after (bottom) editing the left and right swing intervals. The swing interval function curves are rescaled based on the modified time domain. In this example, the user/artist is alerted to an error when the animation engine detects that double support duration is below a minimum threshold after adjusting the intervals.

If an updated parameter value is deemed invalid by the animation engine, the sample editor 1040 will display an error message to notify the user. Custom graphics can also be added to the 3D visualizer 1010 to warn the animator when the character's joints approach position, velocity, and/or torque limits. This immediate visual feedback allows the artist to catch potential issues early in the design phase and adjust the sample parameters to achieve the desired safety margins. When the animator is finished editing the samples for a given style, the style parameters can be saved to style file for later use.

In test mode, the user can interactively control the character's walking velocity using a joystick as in a video game or other input device. With the style browser 1020, the user can also load various walking styles in real time. By observing the final behavior of the animation engine during arbitrary walking tasks via the animated 3D model of the target robot in the 3D visualizer 1010, an animator can quickly evaluate and compare walking styles and validate the results before finalizing a set of parameters. The user can also easily switch between edit and test modes to audition changes to sample parameters. Depending on the desired application, the animation engine can also be run with a physics-based simulator in the loop as a final validation step to determine whether the walking style is dynamically feasible.

The new system with its animation engine and animation editor provides a number of advantages over and has a number of differences from prior techniques for designing walking gaits for legged robots. The system enables rapid design of stylized walking gaits for robotic characters. No prior tools with similar stylization capabilities have used procedural animation techniques that can be deployed on physical robots. The system and its tools provide instant visual feedback when animating stylized gaits. The system reduces design time to deploy physically feasible walking motions on hardware. The system enables easy modification and transfer of styles to different robots, and it can be implemented at reduced cost compared to techniques involving collecting motion capture data. The system can be used to generate large amounts of animation data to build a training set for learning-based methods.

The gait design method allows artists to design physically feasible walking gaits that transfer directly to the target hardware. Unlike prior methods, there is no need to retarget the animation content onto a robot model or train a learning-based policy based on a motion capture data set. During the design phase, the artist is provided with immediate feedback regarding the feasibility of the gait and has control over the final result. This is especially useful and desirable when animating stylized characters as it is well suited for an animator's creative process. By targeting an animator-driven workflow, it may also be easier using the present techniques to design non-biologically inspired gaits for robotic and other non-human characters.

We claim:

1. A system for providing stylized walking gaits for a legged robot, comprising:
   memory storing, for each animation style of a set of animation styles, a walking gait sample complying with kinematic and dynamic constraints associated with the legged robot at each of a plurality of velocities;
   a processor communicatively linked to the memory; and
   an animation engine provided by the processor running software,
   wherein the animation engine receives as user input a desired velocity for the legged robot, a selection of one of the animation styles, and a robot state for either the legged robot or a simulation of the legged robot, and
   wherein the animation engine generates actuator commands to animate the legged robot or the simulation of the legged robot with a stylized walking gait modifying the walking gait sample based on the desired velocity, the selected one of the animation styles, and the robot state.

2. The system of claim 1, wherein each of the walking gait samples comprises a gait parameter vector paired with an associated gait velocity.

3. The system of claim 1, wherein each of the walking gait samples is defined by a set of parameters including time intervals, attributes, and function curves.

4. The system of claim 3, wherein the attributes include stance splay, and stance width for the legged robot.

5. The system of claim 3, wherein the function curves include left and right foot translation and rotation curves defined for each swing interval.

6. The system of claim 3, wherein the function curves are selected from the group of function curves comprising left sole translation, left sole rotation, right sole translation, right sole rotation, pelvis z translation, pelvis rotation angles, left arm joint angles, right arm joint angles, spine joint angles, and neck joint angles.

7. The system of claim 3, further comprising an animation editor provided by the processor running software, wherein the animation editor generates a graphical user interface (GUI), and wherein the GUI includes a three dimensional (3D) visualizer displaying a 3D model of the simulation of the legged robot animated based on the actuator commands.

8. The system of claim 7, wherein the GUI is adapted to receive user input modifying at least one of the parameters, the desired velocity, or the selected one of the animation styles and wherein the animation engine, in response, generates additional actuator commands and the animation editor displays a revised 3D model of the simulation of the legged robot animated based on the additional actuator commands.

9. The system of claim 8, wherein the user input includes modifying one or more waypoints in one of the function curves displayed in the GUI.

10. The system of claim 3, wherein the animation engine comprises a sample blender providing sample interpolation of the walking gait samples for use in generating the actuator commands and wherein the sample interpolation comprises blending the set of parameters including one or more of the time intervals, the attributes, and the function curves.

11. The system of claim 10, wherein the sample interpolation comprises use of gait phase maps to blend time-varying function curves from multiple walk cycles in a manner that preserves contact event-based timing constraints in blended curves.

12. A system for providing stylized walking gaits for a target bipedal robot, comprising:
  memory storing, for each animation style of a set of animation styles, a walking gait sample complying with kinematic and dynamic constraints associated with the target bipedal robot at each of a plurality of velocities;
  a processor communicatively linked to the memory; and
  an animation editor provided by the processor running software,
  wherein the animation editor generates a graphical user interface (GUI),
  wherein the GUI includes a three dimensional (3D) visualizer displaying a 3D model of the target bipedal robot simulated with animation based on a set of actuator commands, and
  wherein the set of actuator commands animate the 3D model with a stylized walking gait modifying the walking gait sample based on a velocity and one of the animation styles selected by a user via interaction with the GUI.

13. The system of claim 12, wherein each of the walking gait samples is defined by a set of parameters including time intervals, attributes, and function curves.

14. The system of claim 13, wherein the GUI is adapted to receive user input modifying at least one of the parameters, the desired velocity, or the selected one of the animation styles and wherein the animation engine, in response, generates a second set of actuator commands differing from the set of actuator commands and the animation editor displays a revised 3D model of the simulation of the legged robot animated based on the second set of actuator commands.

15. The system of claim 14, wherein the user input includes modifying one or more waypoints in one of the function curves displayed in the GUI.

16. The system of claim 14, further comprising an animation engine provided by the processor running software, wherein the animation engine receives as input the velocity, the one of the animation styles, and a robot state for the simulation of the target bipedal robot, and wherein the animation engine generates the set of actuator commands.

17. The system of claim 16, wherein the animation engine comprises a sample blender providing sample interpolation of the walking gait samples for use in generating the actuator commands and wherein the sample interpolation comprises blending a time-varying subset of the parameters that are constrained based on contact events.

18. The system of claim 14, wherein the attributes include stance splay and stance width for the legged robot.

19. The system of claim 14, wherein the function curves include left and right foot translation and rotation curves defined for each swing interval.

20. A method of designing a stylized walking gait for a bipedal robot, comprising:
  storing in memory storing, for each animation style of a set of animation styles, a walking gait sample complying with kinematic and dynamic constraints associated with the bipedal robot at each of a plurality of velocities;
  via a GUI, receiving user input indicating a desired velocity for the bipedal robot and a selection of one of the animation styles, and
  generating a set of actuator commands to animate the bipedal robot or a simulation of the bipedal robot with a stylized walking gait modifying the walking gait sample based on the desired velocity and the selected one of the animation styles;
  generating and displaying a 3D model of the simulation of the bipedal robot animated based on the set of actuator commands;
  via the GUI, receiving user input modifying at least one of the parameters, the desired velocity, or the selected one of the animation styles; and
  modifying the set of actuator commands based on the user input and then repeating the step of generating and displaying the 3D model of the simulation of the bipedal robot animated based on the modified set of actuator commands.

21. The method of claim 20, wherein each of the walking gait samples is defined by a set of parameters including time intervals, attributes, and function curves, wherein the user input modifies a value of at least one of the parameters, wherein the attributes include nominal stance parameters that determine procedural foothold placement, and wherein the function curves include left and right foot translation and rotation curves defined for each swing interval.

22. The system of claim 1, wherein each of the walking gait samples that are used as input to define the stylized walking gait is authored by an animator using the animation editor.

* * * * *